United States Patent
Darabi (10) Patent No.: US 6,845,232 B2
(45) Date of Patent: Jan. 18, 2005

(54) ANALOG PEAK DETECTION CIRCUITRY FOR RADIO RECEIVERS

(75) Inventor: Hooman Darabi, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 432 days.

(21) Appl. No.: 10/138,675

(22) Filed: May 3, 2002

(65) Prior Publication Data

US 2003/0181175 A1 Sep. 25, 2003

Related U.S. Application Data

(60) Provisional application No. 60/367,904, filed on Mar. 25, 2002.

(51) Int. Cl.[7] .................................................. H04B 1/06
(52) U.S. Cl. ................................ 455/240.1; 455/232.1; 455/245.1; 375/345
(58) Field of Search ............................... 455/136, 226.1, 455/226.2, 232.1, 240.1, 245.1, 250.1, 263, 247.1, 293, 309, 252.1; 327/58, 59, 62, 359; 330/253, 257, 277, 288; 375/345

(56) References Cited

U.S. PATENT DOCUMENTS

| | | | | |
|---|---|---|---|---|
| 6,373,909 B2 | * | 4/2002 | Lindquist et al. | 375/346 |
| 6,374,097 B1 | * | 4/2002 | Kudou | 455/232.1 |
| 6,442,380 B1 | * | 8/2002 | Mohindra | 455/234.1 |
| 6,510,188 B1 | * | 1/2003 | Isaksen et al. | 375/345 |
| 6,625,424 B1 | * | 9/2003 | Mohindra | 455/84 |

* cited by examiner

*Primary Examiner*—Nguyen Vo
*Assistant Examiner*—Nhan T Le
(74) *Attorney, Agent, or Firm*—Garlick, Harrison & Markison, LLP; James A. Harrison (57) ABSTRACT

A receiver portion of a radio includes an analog circuit for determining a peak amplitude in a way that eliminates or reduces the effects of frequency errors that are introduced by crystals within filters and other devices. A voltage follower and a current mirror in which a MOSFET coupled to an output node produces a voltage across its gate to source terminals whose value is a function of a sum of the gate to source voltages of two MOSFET devices that receive a logarithm of an I modulated channel and a logarithm of a Q modulated channel, respectively.

21 Claims, 7 Drawing Sheets

ANALOG PEAK DETECTION CIRCUITRY FOR RADIO RECEIVERS

CROSS-REFERENCE TO RELATED APPLICATIONS

This application claims priority to and incorporates by reference U.S. Provisional Application entitled, "Method and Apparatus for a Radio Transceiver", having a Ser. No. of 60/367,904 and a filing date of Mar. 25, 2002.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts it to IF and then to baseband. In other systems, the received RF is converted directly to baseband.

In the initial signal processing stages of an RF receiver, the received RF signal is converted to baseband through one or more steps. Initially, the received RF is mixed with a local oscillator (LO) to down convert the carrier frequency to baseband. It is common to utilize a low pass filter coupled to the output of the mixer to remove introduced interference. One problem with using a mixer and low pass filter, however, is that both add a fixed amount of gain to the received signal, irrespective of the received signal strength. This amplified signal is passed to the baseband processor, which is sensitive to excessive signal strength that can cause quantification errors in downstream analog-to-digital converters (ADCs) and saturation in the output devices. One approach that may be used is to limit the amount of power received by the mixer and low pass filter by adjusting the gain of the receiver's low noise amplifier (LNA) according to a received signal strength. This approach, however, requires a method to detect the peak amplitude of the received signal then provide a gain control signal to the receiver's LNA that is proportional to the received signal amplitude.

Since a received signal was transmitted using common modulation techniques that include I and Q signal components, one method of detecting the peak amplitude is to take the square root of the sum of I squared and Q squared $[(I^2+Q^2)^{1/2}]$. The square root function is traditionally performed using a digital signal processor (DSP) in the digital domain on baseband signals. Unfortunately, the DSP function requires processing time and, in some cases, may not respond fast enough to avoid saturation or, alternatively, under-amplification of the output stages.

There is a need in the art, therefore, for a circuit and a method to detect a peak amplitude of a modulated multi-channel signal. Some designs have attempted to satisfy this need by developing an analog system that produces an output that is proportional to the sum of the logarithms of the I and Q modulated channels' amplitude components. In a theoretical world, such an approach is satisfactory. In a real world, however, because oscillators that are used to down convert received RF include crystals that are not perfect and tend to vary from a specified frequency, they introduce a frequency error that effectively adds a modulation component to the logarithms of the I and Q modulated channels' amplitude components.

This modulation component tends to cause the peak amplitude determination to fluctuate thereby causing amplifiers whose gain is adjusted in response to detected peak values of a signal to fluctuate in a corresponding manner. Accordingly, there is a need for an analog peak amplitude detector that eliminates or minimizes the effects of the modulated components that are added due to frequency errors introduced by upstream devices.

SUMMARY OF THE INVENTION

A receiver portion of a radio includes a method and a circuit for determining a peak amplitude of a modulated signal with analog circuitry to enable one or more amplifiers to quickly adjust the amplification level in response to the fluctuations in the peak amplitude of a received signal. More specifically, an analog peak amplitude detector is formed within an integrated circuit to provide fast gain control signals. The circuit is particularly advantageous for systems employing constant envelope modulation systems, such as BPSK modulation, in that it eliminates or reduces the effects of frequency errors that are introduced by active devices, such as oscillators. Accordingly, the output signal reflecting a peak amplitude demonstrates better stability and reduces unnecessary fluctuations in the amplifier stages whose gain level is adjusted in response to a detected peak value. Thus, gain control circuits are better able to provide accurate control signals that fluctuate less and more accurately reflect a needed gain control step.

The invention more specifically includes a circuit comprising a current mirror and voltage follower configuration in which an output MOSFET coupled to an output node produces a voltage whose value is a function of the gate to source voltage amplitudes of two input MOSFET devices that receive the logarithm of the I component and the Q components of the modulated signal, respectively. Because the output signal is extracted from a MOSFET whose gate to source voltage is a function of the gate to source voltage amplitude of the two input MOSFETs, the effect of modulation errors introduced by frequency errors in upstream active components, such as oscillators, may be reduced or eliminated.

In the described embodiment of the invention, a pair of MOSFETs are provided to form a current mirror configuration wherein the source terminals of the current mirror MOSFETs are coupled to a source voltage. Accordingly, by the nature of current mirrors, the current in a first MOSFET of the current mirror that is coupled to the pair of input MOSFETs for receiving the log(I) and log(Q) modulated channel inputs is replicated or mirrored in a second MOSFET of the current mirror. Thus, an output stage MOSFET, whose gate and drain are tied to the current mirror is a voltage follower for the two input MOSFETs. Given the circuit arrangement, and because the output stage MOSFET has a gate to source voltage that is substantially proportional to the gate to source voltage amplitude of the two input MOSFETs, a fairly stable peak amplitude value may be produced on an output node despite frequency error induced modulation components.

Because the output stage MOSFET is a voltage follower relative to the two input MOSFETs, the present invention further includes circuitry for producing the log(I) and log(Q) signals to the inputs of the input MOSFETs. As is known, the log of the modulated sine wave is a nearly constant amplitude signal with repeating notches. Accordingly, by inputting the log of (I) into one input MOSFET and the log of (Q) into the other input MOSFET of an input MOSFET pair, and by having a voltage follower configuration, the output across the voltage follower will be a function of the sum of the amplitudes of the log of (I) and log of (Q) signals. Given the waveform of the log (I) and log (Q) signals as described above, the output may be approximately represented as (a)*square root (2) for a peak value. More specifically, the output will primarily equal a*square root (2) with occasional notches that drop the output to (a) where (a) is the peak amplitude of the input log(I) and log(Q) signals produced to the input MOSFETs.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
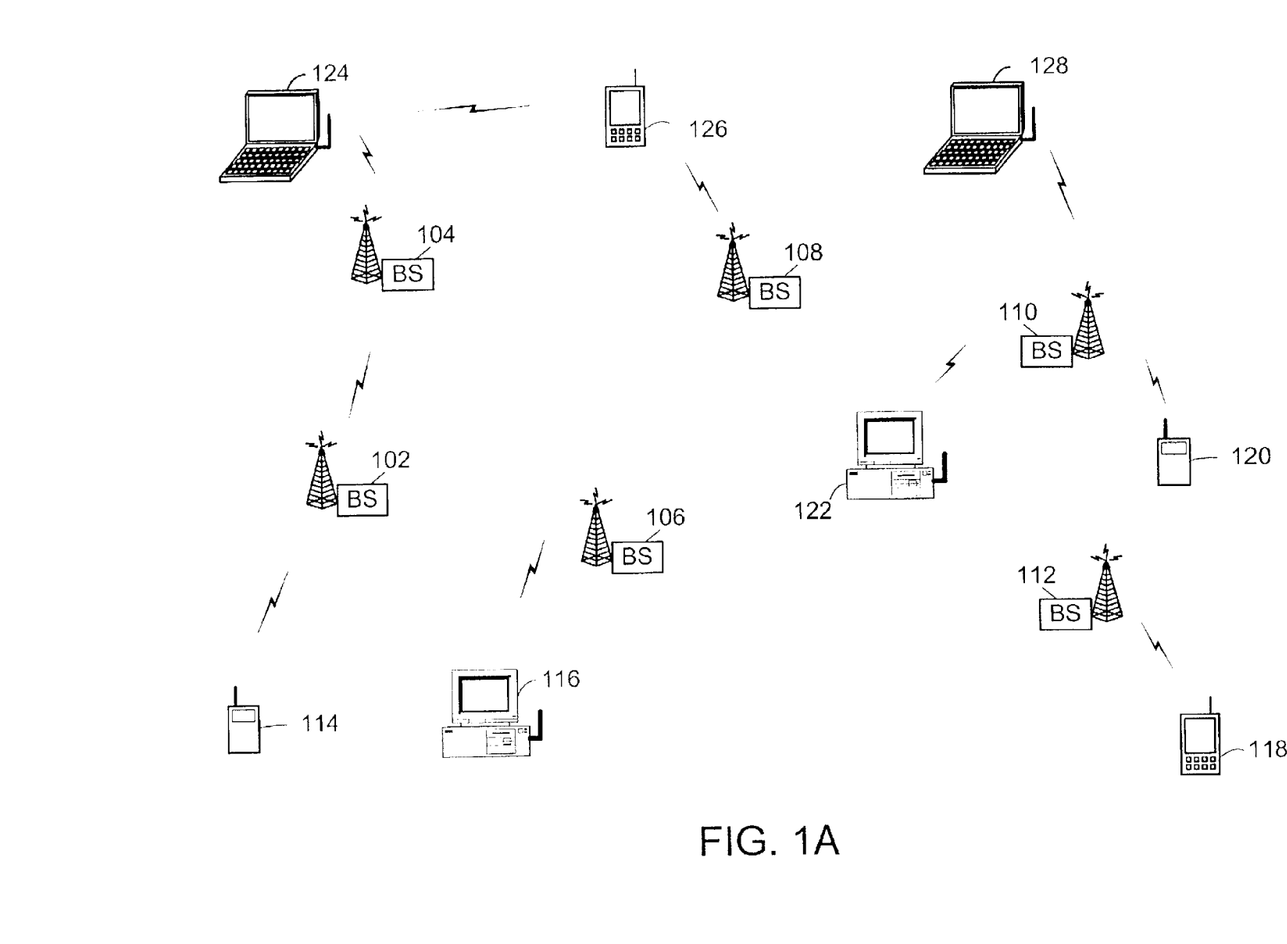
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 124 and wireless handset device 126. The fast growth of the mobile communications market and for networks as shown in FIG. 1A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses GFSK modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on BPSK and QPSK constellations at 11 Mbits/s. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 1A and 1B include the inventive peak detector that reduces the effects of frequency errors from active devices such as local oscillators (from phase locked loop circuits, for example) that are modulated onto received signals and, as a result, cause fluctuations in detected peak values and, therefore, corresponding gain control commands from gain control circuits that respond to the detected peak values.

Figure 1B:
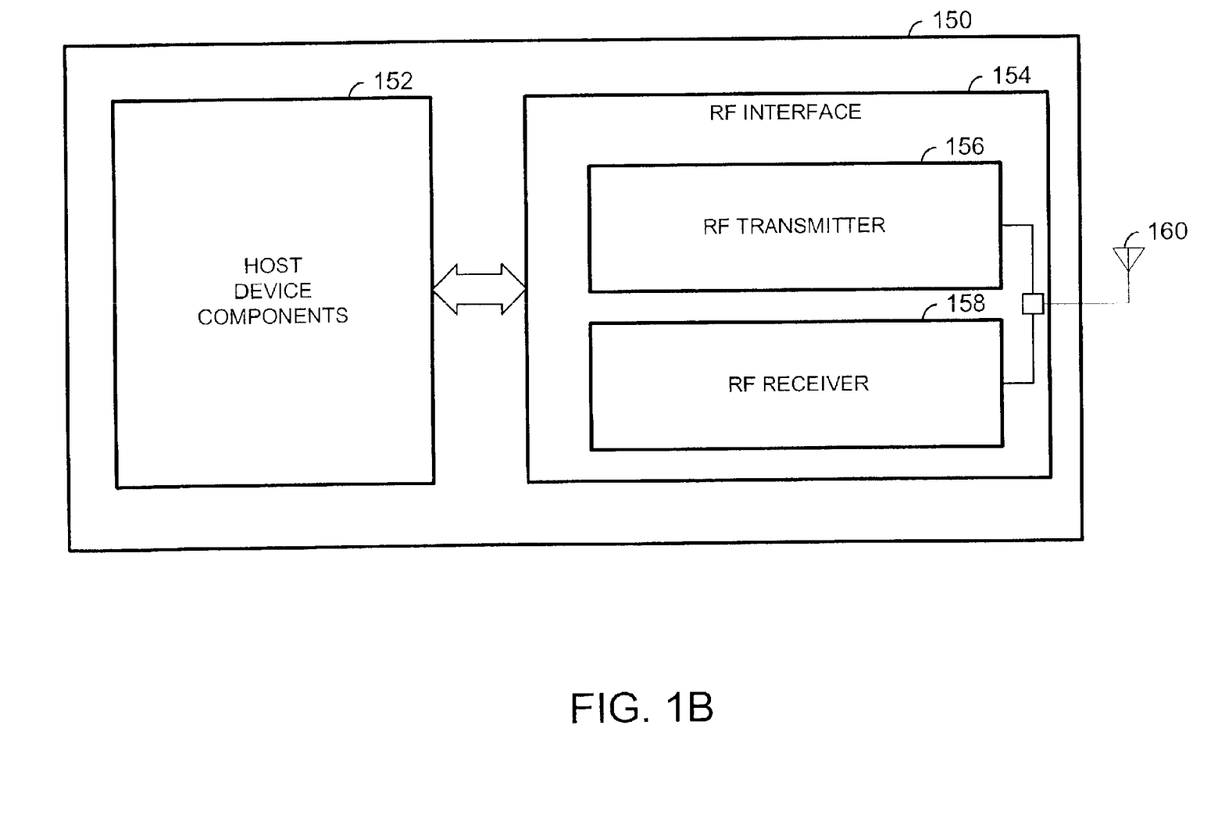
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154. In general, however, the radio receiver of the present invention includes circuitry for receiving and interpreting constant modulation format signals. Additionally, the circuit portion that receives and interprets the RF includes analog peak detection circuitry formed according to the present invention so that the received signals may be amplified to specified levels with accuracy. Thus, the inventive circuitry includes analog peak detection circuitry that provides stable gain measurements that are used to generate gain level control signals for one of the radio amplifiers (e.g., a low noise amplifier at the input of the radio as in the described embodiment of the invention or another amplifier such as a programmable gain amplifier that is typically coupled downstream from mixing and filtering circuitry but prior to baseband processing circuitry.

Figure 2:
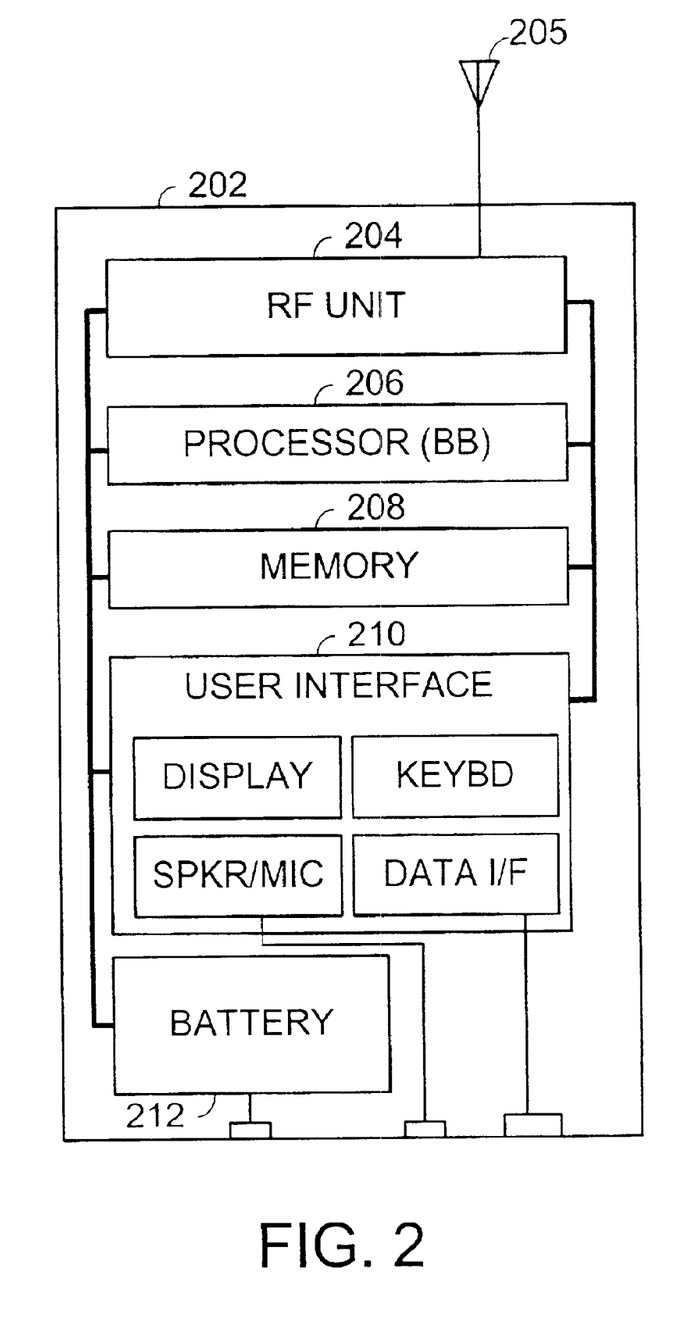
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the peak detection circuit as described herein. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A.

Figure 3:
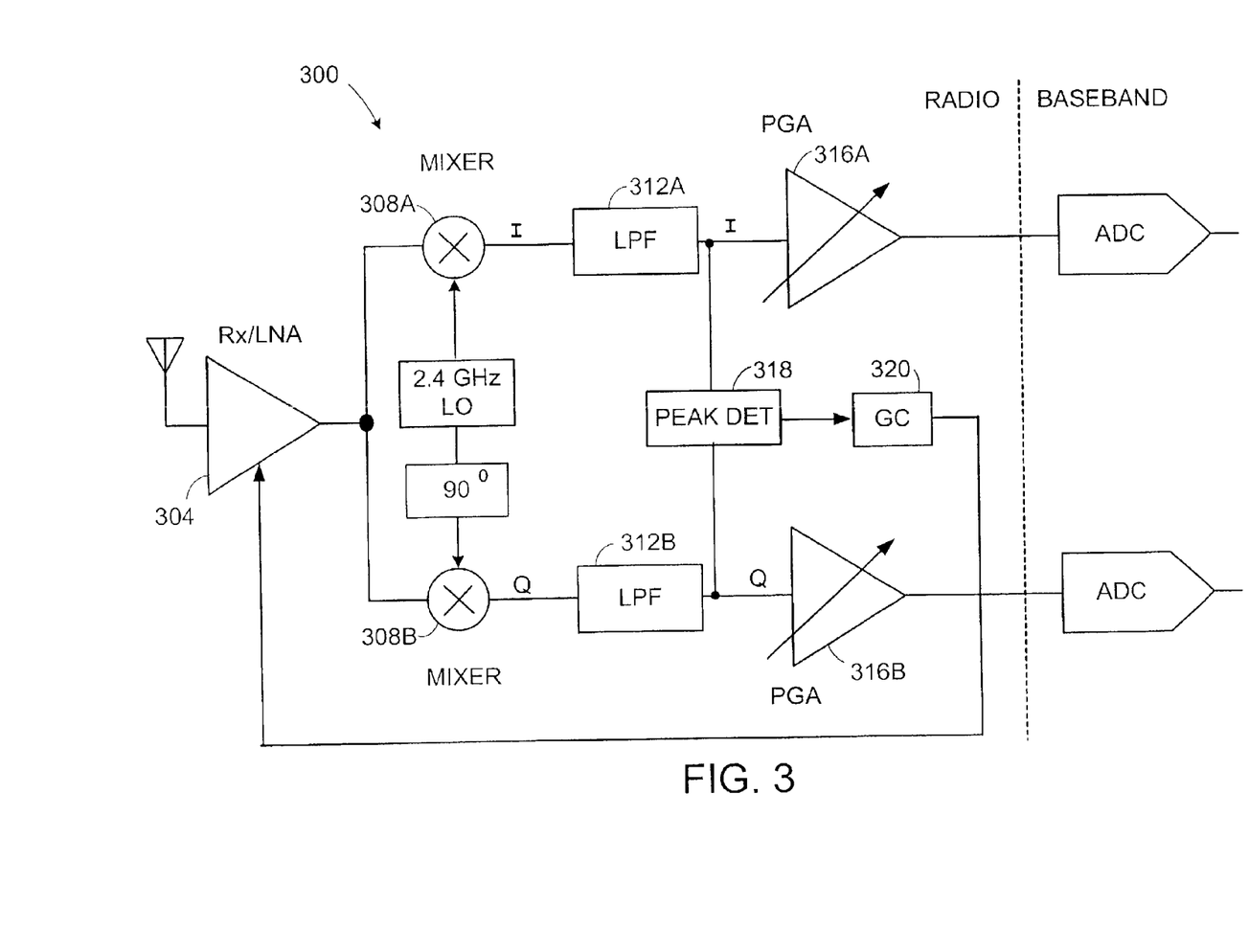
FIG. 3 is a functional schematic block diagram of an RF processing unit of a radio receiver formed according to one embodiment of the present invention.

FIG. 3 is a functional schematic block diagram of an RF processing unit of a radio receiver formed according to one embodiment of the present invention. An RF receiver unit 300 initially receives a radio frequency signal at a receiver/low noise amplifier (LNA) 304 that is coupled to receive wireless communications by way of an antenna. As is known by one of average skill in the art, radio communications typically employ one of many different modulation techniques, including Quadrature Phase Shift Keying (QPSK). In the described embodiment, BPSK modulation is utilized, although other types of modulation techniques may be used. Accordingly, receiver/LNA 304 produces an amplified signal to mixers 308A and 308B for separation into the I and Q modulated channels as is known by one of average skill in the art. The mixers 308A and 308B down convert the amplified signal received from the receiver/LNA 304 from RF to a baseband modulated channel by mixing the received RF signal with a local oscillation in the described embodiment.

In the described embodiment of the invention, the radio receiver is formed to satisfy 802.11b design requirements (although it could also be implemented to satisfy other network requirements, e.g., Bluetooth). Accordingly, the received RF signal is centered about a 2.4 GHz center frequency channel and is then down converted by mixers 308A and 308B. Thereafter, mixers 308A and 308B produce the down converted I and Q modulated channels to low pass filters 312A and 312B, respectively.

As is known, low pass filters 312A and 312B are for blocking or attenuating all communication signals above a specified corner frequency. The outputs of low pass filters 312A and 312B are then produced to programmable gain amplifiers (PGAs) 316A and 316B. The outputs of low pass filters 312A and 312B also are produced to peak detector 318 that determines a peak amplitude that it produces to gain control circuitry 320. Gain control circuitry 320 generates control commands to receiver/LNA 304 to increase or decrease its gain level responsive to the peak amplitude that was produced by peak detector 318. In the described embodiment, the analog-to-digital converters (ADC) for extracting and processing the information within the I and Q modulated channels are within the baseband processing circuitry external to the IF radio integrated circuit.

Each of the components in this path thus far, namely, receiver/LNA 304, mixer 308A and 308B, and low pass filters 312A and 312B, add gain to the received signals in the described embodiment of the invention. Because the amplitude of the received signal can vary dramatically, however, the gain of receiver\LNA 304 is adjusted in response to input signal gain level fluctuations in the described embodiment of the invention. Thus, peak detection circuitry, combined with the receiver/LNA, is provided to facilitate gain adjustments responsive to fluctuations in received signal strength of the received RF signals.

As may be seen, the output of low pass filters 312A and 312B are produced to programmable gain amplifiers (PGAs) 316A and 316B for final amplification prior to being produced to an external baseband processor in the described embodiment of the invention for conversion to the digital domain and for processing. Additionally, however, the inventive peak detection circuit 318 receives the output of low pass filters 312A and 312B and determines a peak value. This peak value may be used as an indication of received signal strength and may be produced to gain control circuitry 320. Gain control circuitry 320 then generates gain control commands to receiver/LNA 304 to increase or decrease its gain level. It should be understood, of course, that the gain control commands could also be used to increase or decrease the gain of the PGAs 316A and 316B as well or in place of the receiver/LNA 304 in alternate embodiments of the invention.

Figure 4A:
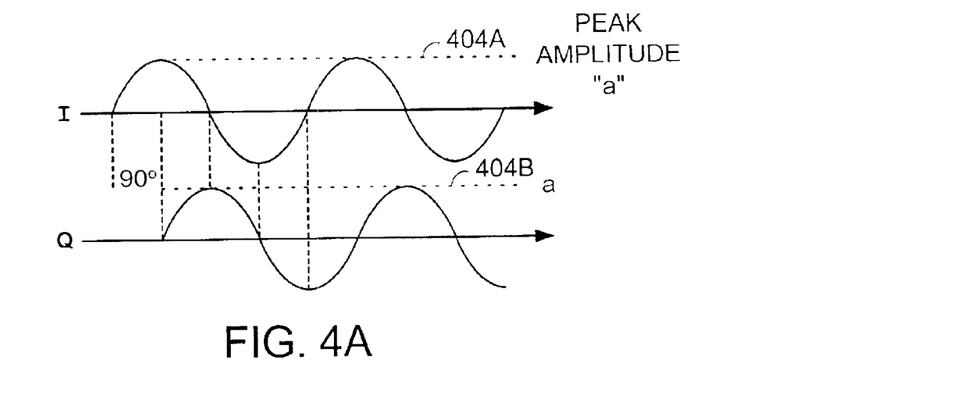
FIGS. 4A through 4D are signal diagrams illustrating a signal on an I modulated channel and on a Q modulated channel and an output signal that is a function of the sum of log(I) and log(Q)
Figure 4B:
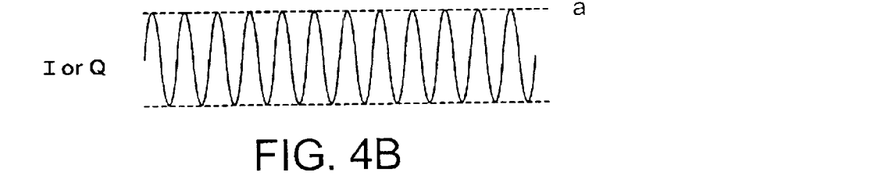
Figure 4C:
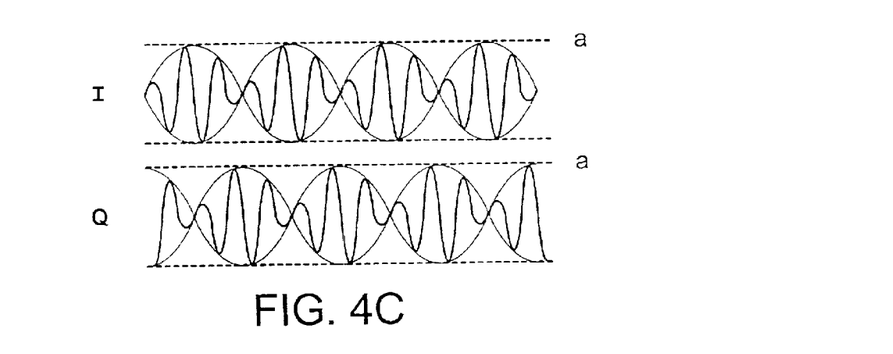
Figure 4D:
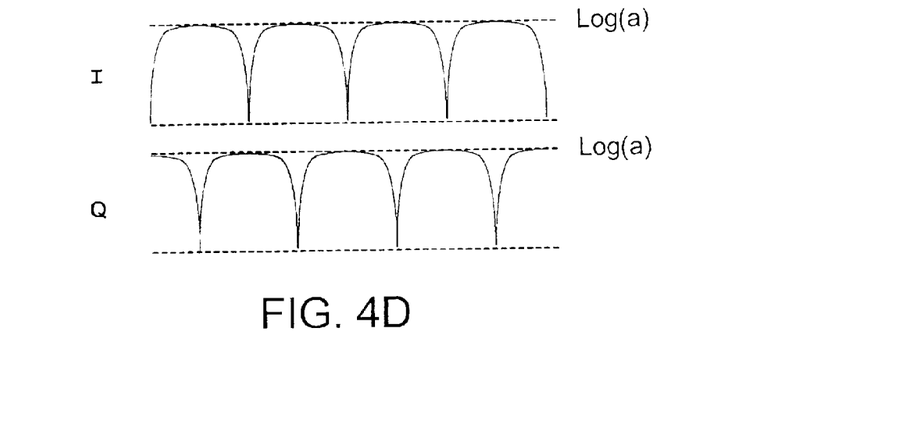

FIGS. 4A through 4D are signal diagrams illustrating a signal on an I modulated channel and on a Q modulated channel and an output signal that is a function of the sum of the log of (I) and log of (Q). Referring to FIG. 4A, a signal on the I modulated channel and on the Q modulated channel each have a peak amplitude of "a" as shown at 404A and 404B. Moreover, as may be seen, the Q modulated channel lags the I modulated channel by ninety degrees. Theoretically, a representation of an ideal signal of the I or Q modulated channel would appear as shown in FIG. 4B. Thus, the peak amplitude remains constant and may readily be deciphered or detected. One problem with frequency oscillators used with phase-locked loops of radio receivers is that crystals used by local oscillators in a receiver tend to introduce small frequency errors (e.g., a 20–30 kHz error). Accordingly, the frequency error is modulated onto the I and Q modulated channel signals to create the signals with a modulated error component as shown in FIG. 4C. Thus, a peak amplitude detector attempting to detect the peak amplitude of the signals shown in FIG. 4C would produce a fluctuating output. FIG. 4D illustrates the waveform for the log(I) and the log(Q) for a modulated sinusoidal signal. As may be seen, at least one of the two signals is always at an approximate peak value. Accordingly, an analog peak amplitude detector formed to proportionally reflect log(I) and log(Q) modulated channels will produce a peak value that is stable and experiences less fluctuation than if the signals of FIG. 4C are used by the peak detector to determine a signal's peak amplitude.

Figure 5:
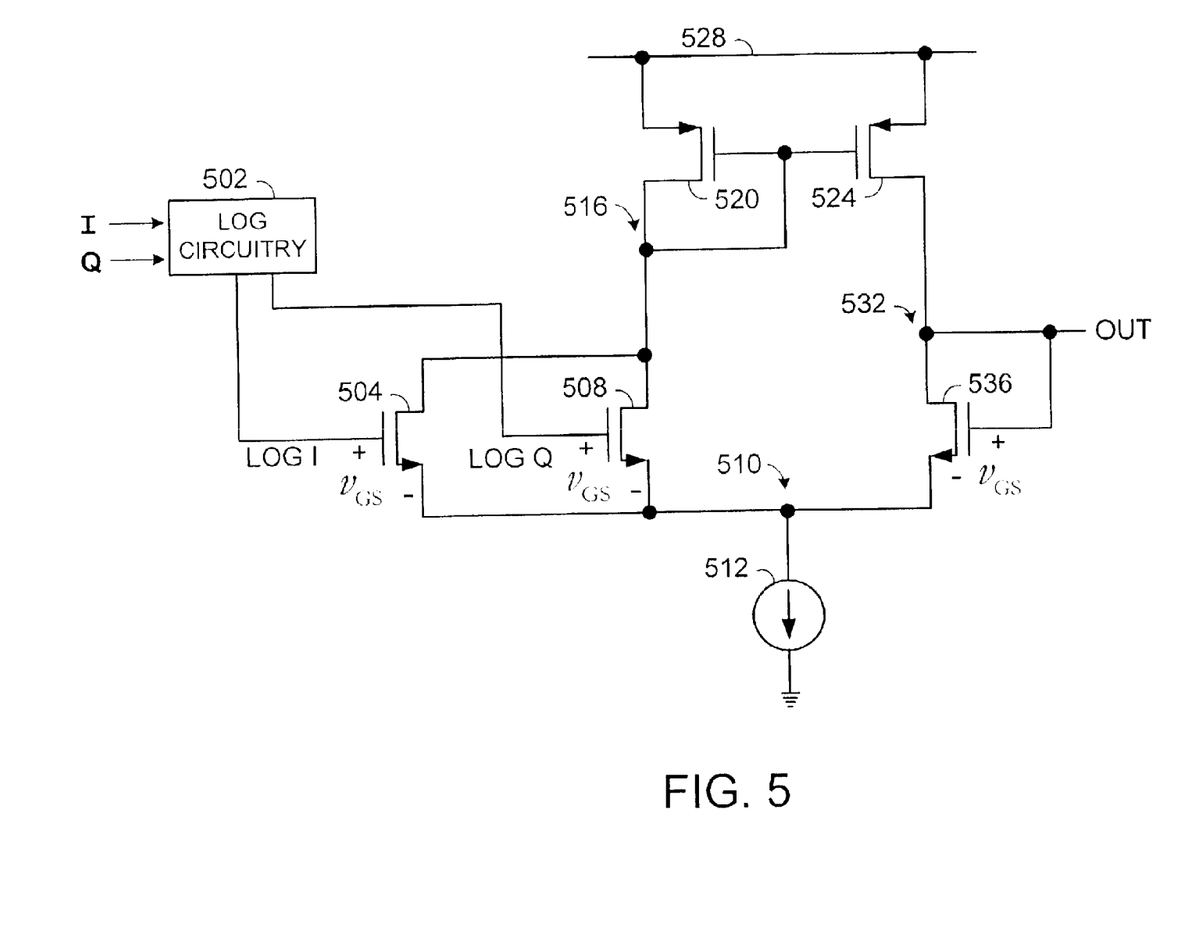
FIG. 5 is a functional schematic block diagram illustrating a peak amplitude detection circuit formed according to one embodiment of the present invention.

FIG. 5 illustrates a peak amplitude detection circuit 318 formed according to one embodiment of the present invention. The outputs from low pass filters, e.g., low pass filters 312A and 312B of FIG. 3, are coupled to log circuitry 502. Log circuitry 502 produces an output that is equal to the log(I) and to the log(Q) to a voltage follower circuit. More particularly, the outputs of log circuitry 502 are produced to the gate terminals of input MOSFETs 504 and 508, respectively. As may be seen, input MOSFETs 504 and 508 are n-channel enhancement MOSFETs connected in parallel wherein the source terminals are coupled to a node 510. Node 510 further is coupled to a current drain 512 that is further coupled to circuit common.

The drain terminals of the input MOSFETs 504 and 508 are connected to a node 516. Node 516 further is coupled to the drain terminal of a p-channel MOSFET 520 and to the gate terminals of a pair of p-channel MOSFETs 520 and 524 that form a current mirror. MOSFETs 520 and 524 are coupled so that their source terminals are connected to the same voltage source 528. Additionally, MOSFETs 520 and 524 have their gate terminals coupled to the same node 516. Due to this configuration, they have equal source to gate terminal voltages and equal drain currents when the transistors 520 and 524 are matched. As one of average skill in the art will appreciate, transistors 520 and 524 may be scaled to provide a desired current ratio between transistors 520 and 524.

The drain terminal of MOSFET 524 is coupled to output node 532. An output MOSFET 536 has drain and gate terminals that also are coupled to an output node 532. The source terminal of output MOSFET 536 is also coupled to node 510. In general, the configuration is a voltage follower wherein the gate to source voltage of output MOSFET 536 is a function of the sum of the gate to source voltage of the input MOSFETs 504 and 508. In a voltage follower circuit as shown in FIG. 5, the current conducted through the input MOSFETs 504 and 508 is defined by the gate to source voltage levels of the input MOSFETs 504 and 508. The current mirror through the output node 532 and through the output MOSFET 536 and to the load reflects this total current through MOSFETs 504 and 508.

In a current mirror, such as that formed by matched p-channel enhancement MOSFETs 520 and 524, the current through each of the two MOSFETs 520 and 524 remain equal. Accordingly, a current that is conducted through the channel of MOSFET 520 and through the combination of input MOSFETs 504 and 508 will be mirrored by an equal current through the channel of MOSFET 524 and, therefore, through output MOSFET 536. In this configuration, the drain current of the output MOSFET 536 is equal to the sum of the drain current of the I input MOSFET 504 and the drain current of the Q input MOSFET 508 assuming that MOSFETs 520 and 524 are matched in channel length, width and design manufacturing tolerance and form a current mirror (assuming current drain from the output node is negligible to an external circuit).

Each MOSFET will conduct a current "I" that is a function of $(V_{GS})^2$ (excluding some constants). For the purpose herein, let $(V_{GS})^2 = a^2$. The current conducted by MOSFET 520 will be equal to 2*I since it has to conduct current for MOSFETs 504 and 506. Due to the current mirror configuration, MOSFET 524 will also conduct 2*I as will MOSFET 536. The voltage at node 532 will be proportional to the gate-to-source voltage of MOSFET 536. Since the drain current is a function of $(V_{GS})^2$, $V_{GS}$ is approximately equal to the square root (2I). Substituting the approximation of $I=a^2$, $V_{GS}$ is equal to (a)*square root (2).

Because each of the input MOSFETs 504 and 508 receives a signal that is equal to the log(I) or the log(Q), however, at least one of the two input MOSFETs 504 or 508 will always have an input voltage that approximately reflects a peak value thereby causing the voltage follower output MOSFET 536 to produce an output voltage that reflects or exceeds a peak value. More specifically, a voltage across the gate to source terminals of the output MOSFET 536 ranges from a magnitude of "a" to a magnitude of (a) * square root (2) because of the square law relationship between current and gate-to-source voltage for a MOSFET in saturation as described above. Given the characteristic of the logarithm of a sine wave as illustrated in FIG. 4D, however, the voltage across the gate to source terminal of the output MOSFET 536 will equal (a) * square root (2) most of the time and will fluctuate to a value (a) only during a "notch" as shown in FIG. 4D. In the described embodiment of the invention, this notch results in a 3 dB drop for a very short duration during the notch portion of the input signal. The majority of the time, however, both inputs will nearly be at a peak value therefore resulting in an output signal that is approximately equal to (a) * square root (2). Therefore, the output voltage will remain nearly constant at a level because of the response curve for the logarithm of the I and Q channels.

Figure 6A:
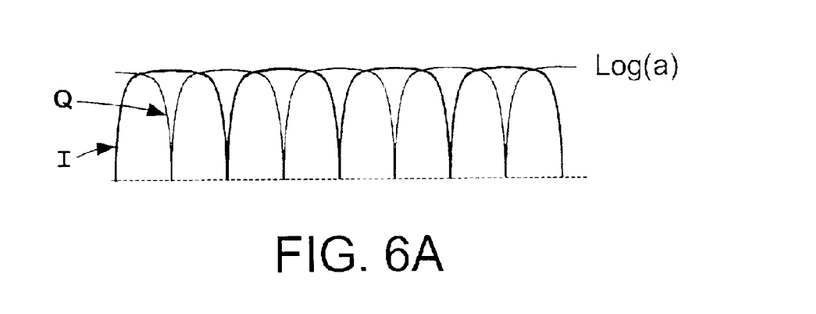
FIGS. 6A and 6B are signal diagrams that illustrate operation of one embodiment of the invention.
Figure 6B:
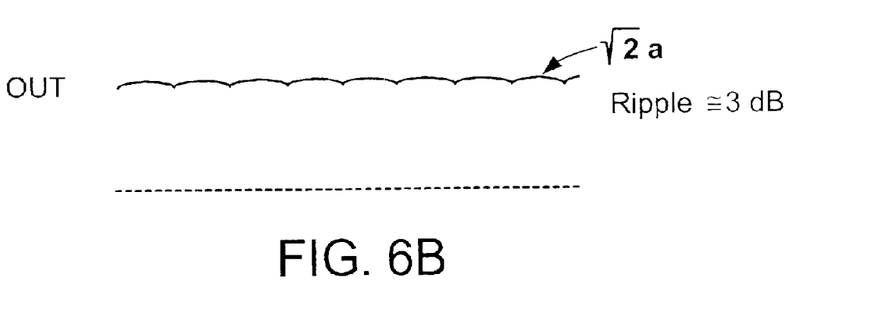

FIGS. 6A and 6B are signal diagrams that illustrate operation of one embodiment of the invention. Referring to FIG. 6A, the input signals are shown in a superimposed manner to illustrate their relative phase difference. A corresponding output of the inventive peak detector is shown in FIG. 6B. As may be seen, the output of the peak detector includes a 3 dB ripple ("a" to "a*square root (2)") but is still significantly more stable than an output of a peak detector formed to detect the peak of a signal such as that shown in FIG. 4C.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A radio receiver formed in an integrated circuit, comprising:
    a low noise amplifier (LNA) coupled to receive an RF signal from an antenna, the LNA for providing amplification of the RF signal in accordance with control commands;
    a mixer coupled to receive an amplified RF signal from the LNA, the mixer for down converting the amplified RF signal into I and Q modulated channels;
    an analog peak amplitude detection circuit further comprising:
        log circuitry for producing an output characterized by the log(x), the log circuitry coupled to receive the I and Q modulated channels and for producing log(I) and log(Q) modulated channel signals; dual input nodes coupled to receive the log(I) and log(Q) modulated channel signals from the log circuitry, one at each input of the dual input nodes; a voltage follower configuration wherein an output signal of the analog peak amplitude detection circuit is a function of the sum of the log(I) and log(Q) modulated channel signals; and
    gain control circuitry coupled to receive the output signal and to produce therefrom the control commands.

2. The radio receiver of claim 1 wherein the peak detection circuit further includes a current sink coupled to a circuit common wherein the dual input nodes are each coupled to a gate terminal of a pair of input MOSFETs each also having a drain terminal and a source terminal, the input MOSFETs coupled in parallel and wherein the source terminals of the input MOSFETs are coupled to the current sink.

3. The radio receiver of claim 2 further including an output MOSFET coupled in a voltage follower configuration wherein the output MOSFET includes a gate terminal coupled to a drain terminal of the output MOSFET and to an output port of the analog peak amplitude detection circuit and further includes a source terminal of the output MOSFET coupled to the current sink.

4. The radio receiver of claim 3 further including a current mirror formed of a first current mirror MOSFET and a second current mirror MOSFET, wherein the first current mirror MOSFET includes a source terminal that is coupled to a voltage source, and a gate terminal and a drain terminal that are both coupled to the drain terminals of the pair of input MOSFETs of the dual input nodes.

5. The radio receiver of claim 4 wherein the second current mirror MOSFET comprises a gate terminal coupled to the gate terminal and drain terminal of the first current mirror MOSFET and a source terminal coupled to the voltage source and a drain terminal coupled to a drain terminal of the output MOSFET.

6. The radio receiver of claim 5 wherein the output signal is a function of a sum of gate to source terminal voltage levels for the input MOSFETs.

7. The radio receiver of claim 6 wherein a gate to source voltage of the output MOSFET is equal to or exceeds the gate to source voltage levels of at least one of the two input MOSFETs.

8. The radio receiver of claim 7 wherein the gate to source voltage level of the output MOSFET is equal to a square root of (2) times an amplitude of at least one of the gate to source voltage levels of the input MOSFETs.

9. An analog peak amplitude detection circuit formed within a radio receiver for detecting a peak of a modulated signal, comprising:
    log circuitry for producing a logarithm of an I modulated channel signal and of a Q modulated channel signal;
    first and second input MOSFETs, each having a gate terminal, a source terminal and a drain terminal, the first input MOSFET coupled to receive the logarithm of the I modulated channel signal at the gate terminal of the first input MOSFET, and the second input MOSFET coupled to receive the logarithm of the Q modulated channel signal at the gate terminal of the second input MOSFET;
    an output node of the analog peak amplitude detection circuit;
    an output MOSFET having a gate terminal, a source terminal and a drain terminal wherein the drain terminal and the gate terminal of the output MOSFET are coupled to the output node of the analog peak amplitude detection circuit;
    a current drain coupled to sink current from the source terminals of the first and second input MOSFETs and the output MOSFET; and
    a current mirror coupled between a voltage source and the drain terminals of the first and second input MOSFETs and the drain terminal of the output MOSFET.

10. The analog peak amplitude detection circuit of claim 9 wherein the current mirror comprises a first and second current mirror MOSFET, each of the at least two MOSFETs having gate terminals wherein the gate terminals of the first and second current mirror MOSFETs are coupled together and to the drain terminals of the first and second input MOSFETs.

11. The analog peak amplitude detection circuit of claim 10 wherein the first and second current mirror MOSFETs are p-channel enhancement MOSFETs and wherein the first and second input MOSFETs and the output MOSFET are n-channel enhancement MOSFETs.

12. The analog peak amplitude detection circuit of claim 11 wherein the first and second current mirror MOSFETs further include source terminals coupled to a voltage source.

13. The analog peak amplitude detection circuit of claim 11 wherein a current conducted through the first current mirror MOSFET is reflected in the second current mirror MOSFET.

14. The analog peak amplitude detection circuit of claim 11 wherein a current conducted through the first current mirror MOSFET is reflected in a third current mirror MOSFET coupled to the first and second current mirror MOSFETs.

15. The analog peak amplitude detection circuit of claim 13 wherein an amount of current conducted through the second current mirror MOSFET is conducted into the output node.

16. The analog peak amplitude detection circuit of claim 15 wherein the amount of current conducted through the output node is approximately equal to the amount of current conducted through the first and second input MOSFETs.

17. A method for detecting a peak voltage in an analog circuit, comprising:

receiving a logarithm of an I modulated channel signal having a first amplitude at a gate terminal of a first input MOSFET, the first input MOSFET having a gate, a source and a drain terminal;

receiving a logarithm of a Q modulated channel signal having a second amplitude at a gate terminal of a second input MOSFET, the second input MOSFET having a gate, a source and a drain terminal; and producing an output signal across an output MOSFET's gate and source terminals wherein the output MOSFET's gate terminal is coupled to an output node, the output signal having an amplitude that is a function of a sum of an amplitude of a signal formed across the gate to source terminals of the first and second input MOSFETs.

18. The method of claim 17 further including the step of conducting approximately equal amounts of total current conducted through the input MOSFETs and through the output node.

19. The method of claim 17 further comprising sinking all of the current conducted through the first output MOSFET through a current sink.

20. The method of claim 18 further including sinking at least some of the current conducted through the output node through the current sink.

21. The method of claim 18 further comprising sinking all of the current conducted through the output node and through the output MOSFET wherein the current in the output MOSFET is equal to the total current conducted through the input MOSFETs.

* * * * *